US008721350B2

(12) United States Patent
Liu et al.

(10) Patent No.: US 8,721,350 B2
(45) Date of Patent: May 13, 2014

(54) ELECTRICAL CONNECTOR AND ELECTRICAL CONNECTOR ASSEMBLY

(75) Inventors: Deng Liu, Shanghai (CN); Qilin Chen, Shanghai (CN); Steven Feldman, Cedar Park, TX (US); Steven A. Neu, Cedar Park, TX (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 13/579,479

(22) PCT Filed: Mar. 14, 2011

(86) PCT No.: PCT/US2011/028261
§ 371 (c)(1),
(2), (4) Date: Aug. 16, 2012

(87) PCT Pub. No.: WO2011/119356
PCT Pub. Date: Sep. 29, 2011

(65) Prior Publication Data

US 2013/0012069 A1 Jan. 10, 2013

(30) Foreign Application Priority Data

Mar. 26, 2010 (CN) .......................... 2010 1 0137012

(51) Int. Cl.
*H01R 12/00* (2006.01)
*H05K 1/00* (2006.01)

(52) U.S. Cl.
USPC ............................................... 439/74; 439/65

(58) Field of Classification Search
USPC ....................................... 439/74, 65, 626, 67
See application file for complete search history.

(56) References Cited

U.S. PATENT DOCUMENTS

| | | | | |
|---|---|---|---|---|
| 5,626,482 | A | 5/1997 | Chan et al. | |
| 6,341,966 | B1 | 1/2002 | Takada et al. | |
| 6,561,821 | B1 * | 5/2003 | Yu | 439/74 |
| 6,695,622 | B2 * | 2/2004 | Korsunsky et al. | 439/65 |
| 6,817,868 | B2 | 11/2004 | Matsuo et al. | |
| 6,918,774 | B2 * | 7/2005 | Wu | 439/65 |
| 7,044,748 | B2 * | 5/2006 | Korsunsky et al. | 439/74 |
| 7,658,621 | B2 * | 2/2010 | Brown et al. | 439/74 |
| 7,967,638 | B1 * | 6/2011 | Kline et al. | 439/607.07 |
| 8,425,236 | B2 * | 4/2013 | Cipolla et al. | 439/59 |
| 8,485,831 | B2 * | 7/2013 | Cipolla et al. | 439/74 |
| 2005/0009379 | A1 | 1/2005 | Huang et al. | |
| 2006/0216960 | A1 | 9/2006 | Chang | |
| 2007/0111600 | A1 | 5/2007 | Tokunaga | |
| 2008/0220630 | A1 | 9/2008 | Sipe et al. | |

OTHER PUBLICATIONS

PCT International Search Report for PCT/US2011/028261 dated Oct. 28, 2011, 3 pages.

* cited by examiner

*Primary Examiner* — Hae Moon Hyeon
(74) *Attorney, Agent, or Firm* — Robert S. Moshrefzadeh

(57) ABSTRACT

Disclosed is an electrical connector comprising: at least one flexible electrically connecting element having a plurality of terminals at each end thereof; a first insulation element and a second insulation element configured to position said terminals for electrically connecting with a socket located on a printed circuit board, wherein said first insulation element has a first sidewall and said second insulation element has a second sidewall; and a supporting element having at least one sidewall, configured to engage with said first insulation element and second insulation element. Wherein a displacement space is defined between said at least one sidewall of said supporting element and at least one of said first sidewall and second sidewall to allow said first and second insulation elements to move relative to said supporting element. This present invention also provides an electrical connector assembly.

10 Claims, 4 Drawing Sheets

ELECTRICAL CONNECTOR AND ELECTRICAL CONNECTOR ASSEMBLY

CROSS REFERENCE TO RELATED APPLICATIONS

This application is a national stage filing under 35 U.S.C. 371 of PCT/US2011/028261, filed Mar. 14, 2011, which claims priority to Chinese Application No. 201010137012.0, filed Mar. 26, 2010 the disclosure of which is incorporated by reference in its/their entirety herein.

FIELD OF THE INVENTION

The present invention generally relates to an electrical connector and an electrical connector assembly, and in particular, to an electrical connector for implementing an electrical board-to-board connection between two circuit boards and an electrical connector assembly including the same.

DESCRIPTION OF THE RELATED ART

Electrical board-to-board connectors are broadly applied to various types of electric systems. For instance, in a computerized electric system, typically a main circuit board and a sub-circuit board are electrically connected with each other via a board-to-board connector. The board-to-board connector typically refers to plug or socket connectors attached to two parallel circuit boards, respectively. When two electrical connectors are engaged with each other and form electrical and mechanical connection, electrical conduction is formed between the main circuit board and the sub-circuit board and thus transmission of electrical signals between the two circuit boards can be implemented, meanwhile, engagement of the electrical connectors causes a certain stacking height between the two circuit boards.

U.S. Pat. No. 5,626,482 discloses an electrical connector assembly comprising an plug electrical connector and an electrical socket connector. Tail portions of terminals of each electrical connector are welded to circuit boards in such a manner that the tail portions of the terminals are electrically connected with surfaces of terminals on the circuit boards, so that two circuit boards are electrically connected with each other via the plug electrical connector and the socket electrical connector and a certain stacking height is formed between the two circuit boards. This height is determined by the combined height of the plug electrical connector and the electrical socket connector.

In the conventional electrical connector assembly, the plug electrical connector and the socket electrical connector are attached to two circuit board, respectively, when being mounted, and attachment positions of the plug electrical connector and the socket electrical connector on the circuit boards are in correspondence to each other, so that the plug electrical connector and the socket electrical connector are engaged with each other only when the positions of the two connectors are aligned. However, during practically assembling, the engagement position of the electrical connector may have an offset. Once such offset goes beyond a certain extent, bad electrical or mechanical connection will occur, especially for a case where several electrical connectors are simultaneously attached onto the circuit board. When being engaged the circuit boards, various requirements for the stacking height of the circuit boards are raised. This requires provision of electrical plug connectors and electrical socket connectors having different heights, so that different stacking heights can be achieved by engaging these connectors. As a result, manufacturing the electrical plug connectors and the electrical socket connectors having different heights causes increasing of a manufacturing cost.

SUMMARY

Accordingly, for solving the above-mentioned problems existing in the prior art, this invention provides an electrical connector and an electrical connector assembly for electrically connecting two circuit boards to be adapted for electrical connection between circuit boards which have various stacking heights.

Further, according to the electrical connector and the electrical connector assembly of this invention, good electrical and mechanical connection between the two circuit boards can be achieved even in a case where the connectors have offsets in position.

An embodiment of this invention provides an electrical connector comprising: at least one flexible electrically connecting element having a plurality of terminals at each end thereof; a first insulation element and a second insulation element configured to position said terminals for electrically connecting with a socket located on a printed circuit board, wherein said first insulation element has a first sidewall and said second insulation element has a second sidewall; and a supporting element having at least one sidewall, configured to engage with said first insulation element and second insulation element. Wherein a displacement space is defined between said at least one sidewall of said supporting element and at least one of said first sidewall and second sidewall to allow said first and second insulation elements to move relative to said supporting element.

A further embodiment of this invention provides an electrical connector assembly comprising:

a first electrical connector comprising:

at least one flexible electrically connecting element having a plurality of terminals at each end thereof;

at least two first insulation elements configured to position said terminals for electrically connecting with a mating electrical connector; and a supporting element configured to engage with said first insulation elements, wherein a displacement space is defined between said supporting element and at least one of said first insulation elements; and at least two second electrical connectors each of which comprises:

a second insulation element; and at least one set of connecting terminals positioned in said second insulation element;

wherein said second electrical connectors are engaged at two ends of said first electrical connector, respectively, two ends of said flexible connecting member are electrically connected with one end of the connecting terminals, the other end of the connecting terminals is electrically connected with connecting terminals of a printed circuit board, and a perpendicular displacement between at least one of said first insulation elements and said supporting element in the engagement direction of said first electrical connector with said second electrical connector is allowed.

BRIEF DESCRIPTION OF THE DRAWINGS

The present invention will now be described with reference to the accompanying schematic drawings in which.

Figure 1:
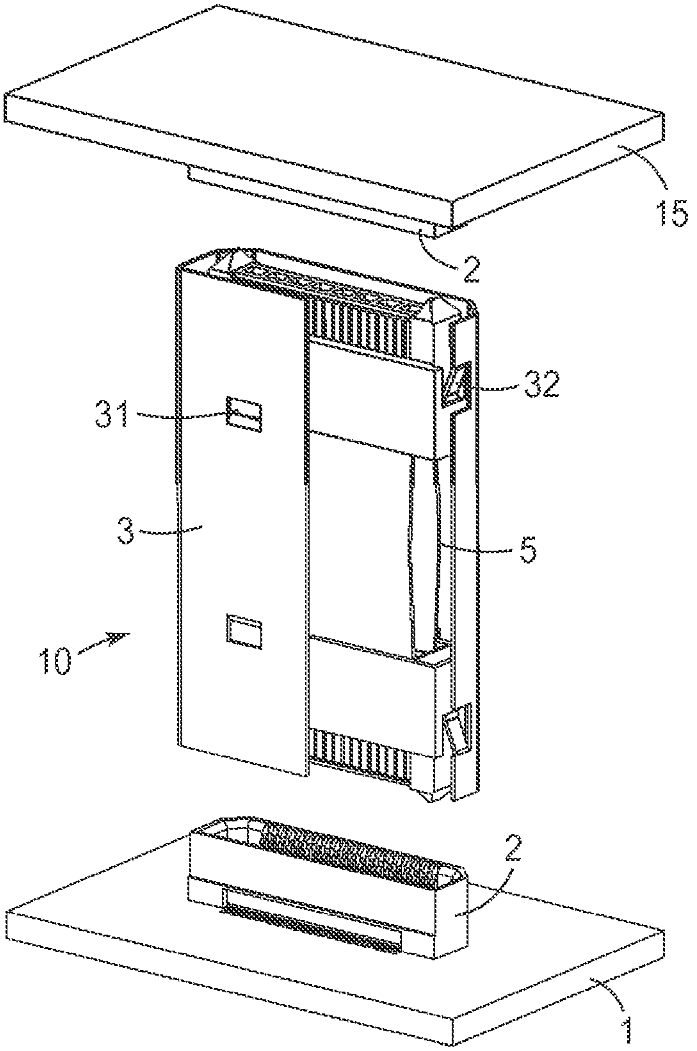
FIG. 1 depicts an exploded schematic diagram of connecting two circuit boards by using the electrical connector assembly according to this invention.

Further disclosure, objects, advantages and aspects of the present invention may be better understood by those skilled in the relevant art by reference to the following description of embodiments taken in conjunction with the accompanying drawings, which are given by way of illustration only, and thus are not limitative of the present invention.

DETAILED DESCRIPTION

Embodiments of this invention will now be described, by way of example only, with reference to the accompanying schematic drawings in which corresponding reference numbers indicate corresponding parts.

An electrical connector 10 according to an exemplary embodiment of this invention will now be described with reference to FIGS. 1-3. The electrical connector 10 can be used for electrical connection between, for example, a printed circuit board 1 and another printed circuit board 15 (hereafter referred to "board-to-board" as simply) in an electric system, such as a computer or like.

The electrical connector 10 comprises two flexible electrically connecting elements 5 having a plurality of terminals (golden fingers) 51 at each end thereof; two insulation elements 4 having the same configuration and configured to position the terminals 51 for electrically connecting with an electrical connector 2, such as a socket, located on the printed circuit board 1, wherein the insulation elements 4 each having a sidewall; and a supporting element having at least one sidewall and configured to engage with the insulation elements 4. A displacement space is defined between the at least one sidewall of the insulation elements 4 and the at least one sidewall of the supporting element to allow the insulation elements 4 to move relative to the supporting element.

In an exemplary embodiment of the electrical connector 10 of this invention, the supporting element may be a housing 3 in a substantially rectangular parallelopiped shape. The housing 3 may be made of metal material, such as a steel plate, to electrically shield signal lines provided therein. The insulation elements 4 may be made of insulation material and are detachably mounted on two ends of the housing 3, respectively. Each insulation element may comprise two substantially rectangular through holes 41 defined by at least one inner wall thereof and two mounting walls 42 adjacent to the through holes 41. The two ends of the two flexible electrically connecting elements 5 pass through the through holes 41, respectively, to be fixed to the corresponding mounting walls 42 of the first and second insulation elements 4, so that the flexible electrically connecting elements 5 are electrically connected with another electrical connector 2 by means of engagement between the first or second insulation elements 4 and the insulation element 21 of the other electrical connector 2. The flexible electrically connecting elements 5 may, for example, be flexible flat cables (FFC) which may, for example, be flexible flat printed cables (FPC or FFPC) with a plurality of circuit traces being printed on a substrate, or may be flat cables with a plurality of wires being embedded in a substrate. The flexible electrically connecting element 5 may be a cable including a plurality of wires, such as a circular cable. When the electrical connector 10 of this invention is engaged with the socket of the printed circuit board 1, the housing 3, being served as the supporting element, is kept perpendicular to the plane of the printed circuit 1.

In an exemplary embodiment, the insulation element 4 comprises a base portion 43 engaged with the supporting element and an engaging portion 44 extending integrally from the middle of the base portion 43 to form the mounting wall 42. The through hole 41 is formed at two sides of the base portion 43 where the engaging portion 44 is provided. The connecting terminals (golden fingers) 51 at one end of the flexible electrically connecting element 5 pass through the through hole 41 to be fixed on the mounting wall 42 by, for example, adhering. It could be appreciated that in this embodiment plug connectors can be formed at two ends of the supporting element to engage with the socket connector 2 mounted on the printed circuit board 1.

Figure 2:
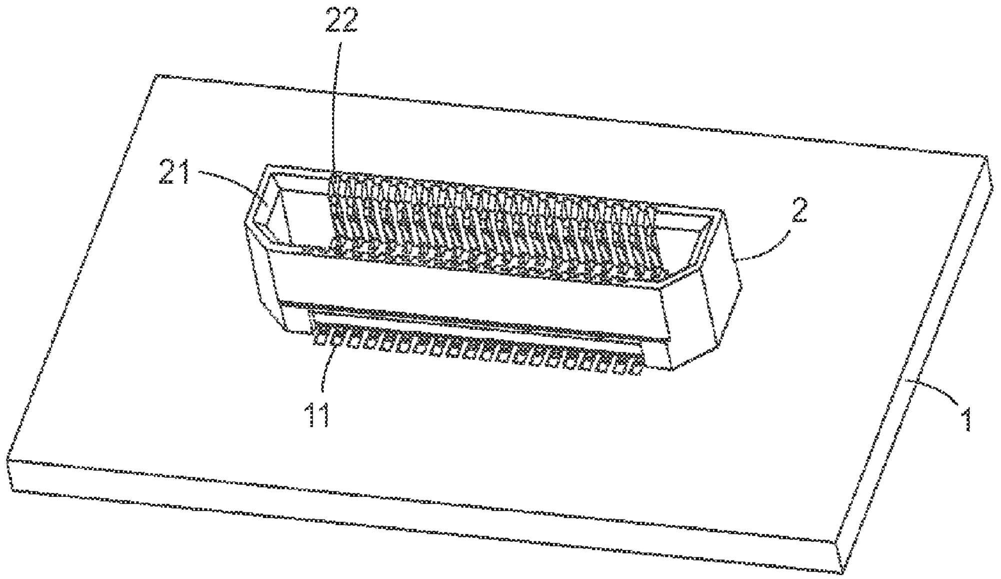
FIG. 2 depicts a perspective schematic diagram of a plate-end type connector attached to the circuit board.
Figure 3:
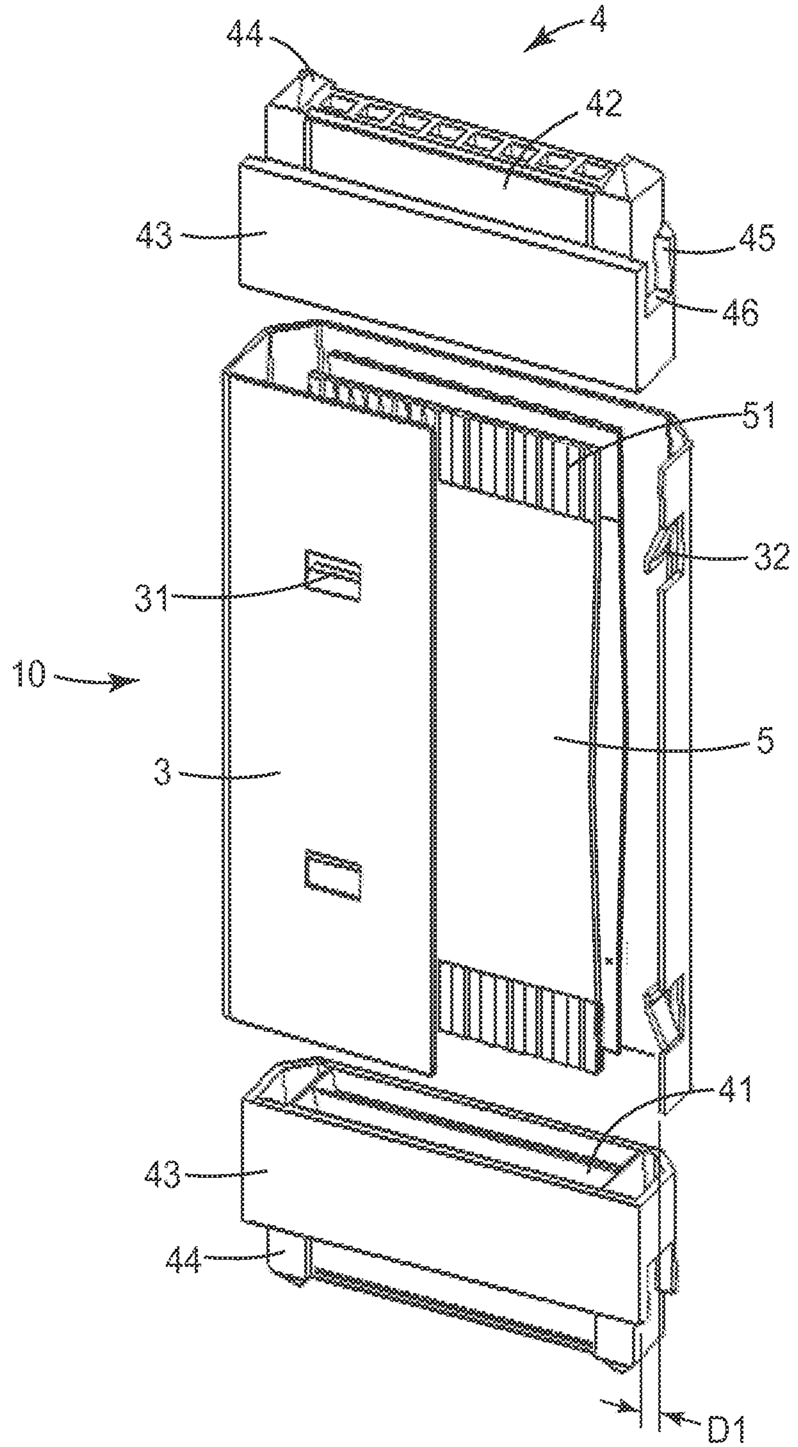
FIG. 3 depicts an exploded schematic diagram of the first connector shown in FIG. 1 according to this invention.

In a further exemplary embodiment, as shown in FIGS. 1 and 3, the housing 3 comprises eight first stopping portions 31 provided at two ends thereof (i.e. four first stopping portions at each end), respectively. The first stopping portion 31 is formed to integrally and inwardly extend from the surface of the housing 3. When the insulation element 4 is inserted into the housing 3 being served as the supporting element, the front edge of the insulation element 4 in an insertion direction will contact with the first stopping portion 31 to stop further insertion of the insulation element 4 into the housing. Further, the housing further comprises two second stopping portions 32 provided at two ends thereof, respectively. The second stopping portion 32 may be formed to integrally and inwardly project from the housing 3 and may be in a claw structure having a predetermined elasticity. Further, the insulation element 4 comprises guiding portions 45 corresponding to the second stopping portions 32. The guiding portion 45 may be a cutout formed on the sidewall surface of the first insulation element 4. The cutout starts from an edge of the base portion 43 of the insulation element 4, extends in the insertion direction of the insulation element 4 being inserted into the housing 3, and ends at a position 46. The cutout 45 does not extend through the whole base portion 43 in the insertion direction. Thus, when the insulation element 4 is inserted into the housing, the second stopping portion 32 inwardly projected is pressed by the base portion 43 to be biased. When or before the front edge of the insulation element 4 just contacts with the first stopping portion 31, the biased second stopping portion 32 will be released into the guiding portion 45 and abutted against the end position 46 of the guiding portion 45. In this way, the second stopping portion 32 is cooperated with the guiding portion 45 to stop the insulation element 4 from separating from the housing 3. Therefore, when the first insulation element 4 is inserted into the housing 3 to a predetermined position, the first stopping portion 31 is fitted with the front edge of the base portion 43, and the second stopping portion 32 is fitted with the end position 46 of the guiding portion 45, so that the insulation element 4 can be stopped from being further inserted into the housing and separating from the housing. In this way, limiting the position of the insulation element 4 can be achieved.

An exemplary embodiment in which the position of the insulation element 4 is limited by four first stopping portions 31 and two second stopping portions 32 provided at an end of the housing, is described as above. However, this invention is not limited thereto. It can be understood that at least one first stopping portion 31 and at least one second stopping portion 32 can be provided at any side of the housing as long as the position of the insulation element 4 can be limited in the insertion direction of the insulation element 4.

In an alternative exemplary embodiment, the housing, being served as the supporting element 3, comprises at least one V-shaped elastic protrusion portion provided at two ends thereof, respectively. The protrusion portion is protruded inwardly from the inside of the housing. The base portion 43 of the insulation element 4 comprises at least one groove portion corresponding to the elastic protrusion portion. The groove portion is recessed in the base portion 43 and extends along a direction perpendicular to the insertion direction. When the insulation element 4 is inserted into the housing 3, the elastic protrusion portion projected inwardly is forced by the base portion 43 to be compressed. When the insulation element 4 is further inserted to a predetermined position, the compressed elastic protrusion portion is released into the groove portion. In this way, the elastic protrusion portion is fitted with the groove portion to stop the insulation element 4 from being further inserted into the housing 3 and being separated from the housing. It can be appreciated that the elastic protrusion portion is fitted with the groove portion in a snap-in manner. If a less force is applied, the elastic protrusion portion is to be kept into the groove portion, and if a greater force is applied, the elastic protrusion portion is to be separated from the groove portion, so that the insulation element 14 is pulled out of the housing.

Figure 4:
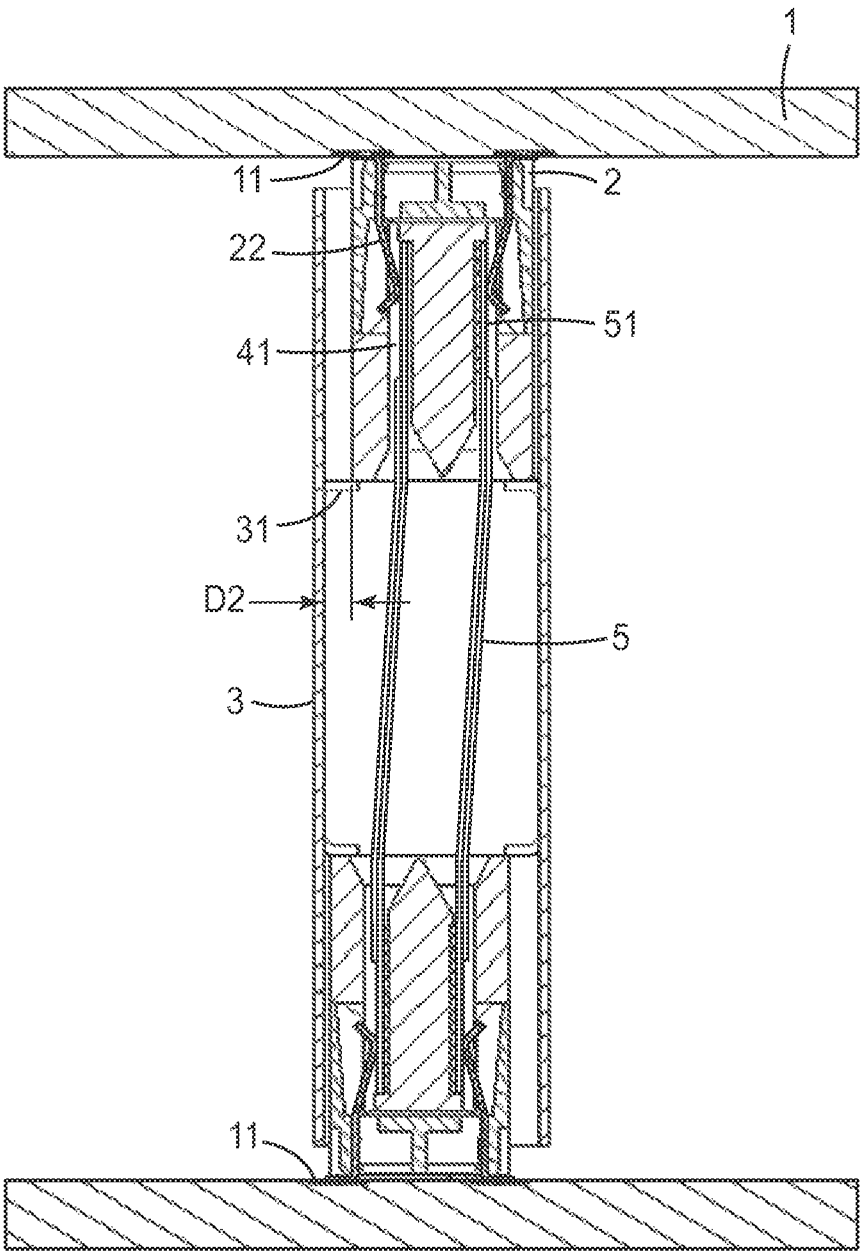
FIG. 4 depicts a cross-section schematic diagram of the electrical connector assembly shown in FIG. 1 when connecting two circuit boards.

According to a further exemplary embodiment of this invention, the length and the width of the insulation element 4 are less than those of the cross section of the inner cavity of the housing, respectively. In other words, there is a predetermined distance between at least one sidewall of the insulation element 4 and the corresponding inner wall of the housing 3. In this way, the insulation element 4 is allowed to slide by a certain distance along the direction perpendicular to the insertion direction within the inner cavity of the housing 3. For example, as shown in FIGS. 3 and 4, the insulation element 4 may be allowed to slide by a maximum distance D1 along the width direction within the housing 3 and to slide by a maximum distance D2 along the thickness direction within the housing 3. The ranges of D1 and D2 may be between 0.4 and 0.8 mm, preferably 0.5 mm. However, no matter how the insulation element 4 is slid within the housing 3, it should be guaranteed that the first stopping portion always stops the front edge of the insulation element 4 and that the second stopping portion 32 always stops the end position 46 of the guiding portion 45. Further, in another embodiment, the elastic protrusion portion is always held in the groove portion.

In an exemplary embodiment according to another aspect of this invention, an electrical connector assembly is provided, comprising the above-described electrical connector 10 as a first electrical connector and two second electrical connectors 2 engaged at two ends of the first electrical connector 10, respectively. As shown in FIGS. 1 and 2, each second electrical connector 2 comprises an insulation element 21 made of insulation material and at least one set of connecting terminals 22. Each set of connecting terminals 22 comprises a plurality of separate connecting terminals made of conductor material. Each connecting terminal is fixed to the mounting wall of the second insulation element 22, for example, by adhering. Further, when the second electrical connectors 2 are engaged at the two ends of the first electrical connector 10, the connecting terminals (golden fingers) 51 at the two ends of the flexible electrically connecting element 5 of the first electrical connector 10 are elastically and electrically connected with one end of the connecting terminals of the second electrical connector 2. The other end of the connecting terminals of the two electrical connectors 2 is electrically connected with a corresponding pad (circuit traces) 11 on the circuit board 1 by soldering, so that the plate-end type first connector 2 is mounted on the circuit board 1, and further an electrical board-to-board connection can be implemented between the two circuit boards by mounting the two second electrical connector 2 to the two ends of the first electrical connector 10.

In the first electrical connector according to this invention, since the insulation element 4 is allowed to slide by a certain distance along the direction perpendicular to the insertion direction within the inner cavity of the housing 3, that is to say, the relative positions of the two insulation elements 4 mounted at the two ends of the housing are allowed to be offset from each other in the direction perpendicular to the engagement direction of the first electrical connector with the second electrical connector. Further, since the flexible electrically connecting element 5 is flexible, good electrical and mechanical connection between the first electrical connector 10 and the two second electrical connectors 2 can be implemented even in a case where the two second electrical connectors 2 have an offset in position. It can be understood that the height of the housing 3 renders the stacking height of the two circuit boards 1 and enables mechanical fixation of the two circuit boards 1.

In the exemplary embodiment of the electrical connector assembly of this invention described as above, the two ends of the first electrical connector 10 are provided as plug type electrical connectors, and the two second electrical connector 2 are socket type electrical connectors. However, it can be understood that it is an alternative embodiment in which the two ends of the first electrical connector 10 are provided as socket type electrical connectors, and the two second electrical connector 2 are plug type electrical connectors. In another embodiment, the two ends of the first electrical connector 10 are a plug type electrical connector and a socket type electrical connector, respectively. Accordingly, the two second electrical connectors 2 are a socket type electrical connector and a plug type electrical connector, respectively.

Further, although the housing 3 is used as the supporting element and the insulation element 4 is received in the supporting element in the above embodiments, it can be understood that the supporting element is not limited to the housing 3. In an alternative embodiment, the insulation element 4 also can be engaged outside of the two ends of the supporting element. In a further embodiment, at one of the two ends of the first electrical connector several second electrical connectors may be provided.

For the first and second electrical connectors according to this invention, mechanical and electrical connection between two circuit boards 1 can be implemented with different stacking heights by replacing housings having different heights, without requiring various plug and socket connectors having different heights. Thus, developing and producing cost can be reduced, and developing cycle can be shortened. Further, in use, the stacking height of the circuit board can be easily adjusted by replacing different housings.

Further, there is a gap between the insulation element 4 engaged at the two ends of the housing 3 and the inner wall of the housing 3. The presence of this gap allows the insulation element 4 and the housing 3 to have an offset from each other in the direction perpendicular to the insertion direction, that is to say, allows the relative positions of the two insulation elements 4 mounted at the two ends of the housing 3 to be offset from each other in the direction perpendicular to the engagement direction of the first electrical connector with the second electrical connector. Further, since the flexible electrically connecting element 5 is flexible, bad electrical and mechanical connection between the first electrical connector 10 and the two second electrical connectors 2 will not occur even in a case where the two second electrical connectors 2 have an offset in position.

Item 1 is an electrical connector (10) comprising:

a flexible electrically connecting element (5) having a plurality of terminals at each end thereof;

a first insulation element and a second insulation element configured to position said terminals for electrically connecting with a socket located on a printed circuit board, wherein said first insulation element has a first sidewall and said second insulation element has a second sidewall; and a supporting element (3) having at least one sidewall, configured to engage with said first insulation element and second insulation element; wherein, a displacement space is defined between said at least one sidewall of said supporting element and at least one of said first sidewall and second sidewall to allow said first and second insulation element to move relative to said supporting element.

Item 2 is the electrical connector according to item 1, wherein said supporting element remains perpendicular to the plane of the printed circuit board when the electrical connector is mounted to the socket.

Item 3 is the electrical connector according to item 1, wherein said supporting element is a housing (3) for receiving said first insulation element and second insulation element at two ends thereof.

Item 4 the electrical connector according to item 1, wherein at least one of said first insulation element and second insulation element includes at least one through hole (41) defined by at least one inside wall to allow said plurality of terminals pass through for electrically connecting with the socket of the printed circuit board.

Item 5 is the electrical connector according to item 3 wherein said housing (3) comprises at least one first stopping portion (31) provided at two ends thereof, respectively, to stop further insertion of said insulation elements (4) into said housing.

Item 6 is the electrical connector according to item 5, wherein said housing (3) further comprises at least a second stopping portion (32), and said first insulation element (4) comprises a cutout (45) for receiving said second stopping portion (32) to prevent said first insulation element (4) from separating from said housing (3).

Item 7 is the electrical connector according to item 3, wherein said housing (3) comprises at least one elastic protrusion portion provided at two ends thereof, respectively, and said first insulation element (4) comprises at least one groove portion corresponding to said elastic protrusion portion, and said elastic protrusion portion is engaged with said groove portion to stop further insertion of said first insulation element (4) into said housing and to prevent said first insulation element from separating from said housing (3).

Item 8 is the electrical connector according to item 4, wherein at least one of said first insulation element (4) and second insulation element further comprises:

a base portion (43) engaged with said supporting element (3); and an engaging portion (44) extending integrally from said base portion (43) to form a mounting wall (42);

wherein the at least one through hole is configured to receive one end of said flexible electrically connecting member.

Item 9 is an electrical connector assembly comprising:

a first electrical connector (10) comprising:

at least one flexible electrically connecting element (5) having a plurality of terminals at each end thereof;

at least two first insulation elements (4) configured to position said terminals for electrically connecting with a mating electrical connector; and a supporting element (3) configured to engage with said first insulation elements, wherein a displacement space is defined between said supporting element and at least one of said first insulation elements; and at least two second electrical connectors (2) each of which comprises:

a second insulation element (21); and at least one set of connecting terminals (22) positioned in said second insulation element (21);

wherein said second electrical connectors (2) are engaged at two ends of said first electrical connector (10), respectively, two ends of said flexible connecting member (5) are electrically connected with one end of the connecting terminals (22), the other end of the connecting terminals is electrically connected with connecting terminals (11) of a printed circuit board (1), and a perpendicular displacement between at least one of said first insulation elements and supporting element relative to an engaging direction of said first electrical connector and said second electrical connector is allowed.

Item 10 is the electrical connector assembly according to item 9, wherein said supporting element is a housing (3) for detachably receiving said first insulation elements at two ends thereof.

The descriptions above are intended to be illustrative. Modifications may be made to the invention and be apparent to one skilled in the art without departing from the scope of the claims set out below.

What is claimed is:

1. An electrical connector (10) comprising:

a flexible electrically connecting element (5) having a plurality of terminals at each end thereof;

a first insulation element and a second insulation element configured to position said terminals for electrically connecting with a socket located on a printed circuit board, wherein said first insulation element has a first sidewall and said second insulation element has a second sidewall; and a supporting element (3) having at least one sidewall, configured to engage with said first insulation element and second insulation element; wherein, a displacement space is defined between said at least one sidewall of said supporting element and at least one of said first sidewall and second sidewall to allow said first and second insulation element to move relative to said supporting element.

2. The electrical connector according to claim 1, wherein said supporting element remains perpendicular to the plane of the printed circuit board when the electrical connector is mounted to the socket.

3. The electrical connector according to claim 1, wherein said supporting element is a housing (3) for receiving said first insulation element and second insulation element at two ends thereof.

4. The electrical connector according to claim 1, wherein at least one of said first insulation element and second insulation element includes at least one through hole (41) defined by at least one inside wall to allow said plurality of terminals pass through for electrically connecting with the socket of the printed circuit board.

5. The electrical connector according to claim 3 wherein said housing (3) comprises at least one first stopping portion (31) provided at two ends thereof, respectively, to stop further insertion of said insulation elements (4) into said housing.

6. The electrical connector according to claim 5, wherein said housing (3) further comprises at least a second stopping portion (32), and said first insulation element (4) comprises a cutout (45) for receiving said second stopping portion (32) to prevent said first insulation element (4) from separating from said housing (3).

7. The electrical connector according to claim 3, wherein said housing (3) comprises at least one elastic protrusion portion provided at two ends thereof, respectively, and said first insulation element (4) comprises at least one groove portion corresponding to said elastic protrusion portion, and said elastic protrusion portion is engaged with said groove portion to stop further insertion of said first insulation element (4) into said housing and to prevent said first insulation element from separating from said housing (3).

8. The electrical connector according to claim 4, wherein at least one of said first insulation element (4) and second insulation element further comprises:

a base portion (43) engaged with said supporting element (3); and an engaging portion (44) extending integrally from said base portion (43) to form a mounting wall (42);

wherein the at least one through hole is configured to receive one end of said flexible electrically connecting element.

9. An electrical connector assembly comprising:

a first electrical connector (10) comprising:

at least one flexible electrically connecting element (5) having a plurality of terminals at each end thereof;

at least two first insulation elements (4) configured to position said terminals for electrically connecting with a mating electrical connector; and a supporting element (3) configured to engage with said first insulation elements, wherein a displacement space is defined between said supporting element and at least one of said first insulation elements; and at least two second electrical connectors (2) each of which comprises:

a second insulation element (21); and at least one set of connecting terminals (22) positioned in said second insulation element (21);

wherein said second electrical connectors (2) are engaged at two ends of said first electrical connector (10), respectively, two ends of said flexible connecting element (5) are electrically connected with one end of the connecting terminals (22), the other end of the connecting terminals is electrically connected with connecting terminals (11) of a printed circuit board (1), and a perpendicular displacement between at least one of said first insulation elements and supporting element relative to an engaging direction of said first electrical connector and said second electrical connector is allowed.

10. The electrical connector assembly according to claim 9, wherein said supporting element is a housing (3) for detachably receiving said first insulation elements at two ends thereof.

* * * * *